(12) United States Patent
Solomko et al.

(10) Patent No.: US 12,550,630 B2
(45) Date of Patent: Feb. 10, 2026

(54) PHASE CHANGE SWITCH ARRANGEMENT

(71) Applicant: Infineon Technologies AG, Neubiberg (DE)

(72) Inventors: Valentyn Solomko, Munich (DE); Semen Syroiezhin, Erlangen (DE); Dominik Heiss, Munich (DE); Christian Butschkow, Munich (DE); Jochen Braumueller, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 602 days.

(21) Appl. No.: 17/961,795

(22) Filed: Oct. 7, 2022

(65) Prior Publication Data
US 2024/0122081 A1    Apr. 11, 2024

(51) Int. Cl.
*H10N 70/20*    (2023.01)
*H10N 70/00*    (2023.01)

(52) U.S. Cl.
CPC ....... *H10N 70/231* (2023.02); *H10N 70/8613* (2023.02); *H10N 70/823* (2023.02)

(58) Field of Classification Search
CPC .................................................. H10N 70/231
See application file for complete search history.

(56) References Cited

U.S. PATENT DOCUMENTS

| 2020/0059229 | A1* | 2/2020 | Howard | G01R 31/3277 |
| 2020/0343214 | A1* | 10/2020 | Seki | H01L 23/66 |
| 2023/0413691 | A1* | 12/2023 | Chang | H10N 70/823 |

OTHER PUBLICATIONS

Lee et al., "RF FPGA for 0.4 to 18 GHz DoD Multi-function Systems", Jan. 2009, 111-114 (Year: 2009).*
Lee, Mike, et al., "RF FPGA for 0.4 to 18 GHz DoD Multi-function Systems", Jan. 2009, 111-114.

* cited by examiner

*Primary Examiner* — Ajay Ojha
*Assistant Examiner* — Hajar Kolahdouzan
(74) *Attorney, Agent, or Firm* — Murphy, Bilak & Homiller, PLLC

(57) ABSTRACT

A phase change switching device includes a substrate comprising a main surface, an RF input pad and a plurality of RF output pads disposed over the main surface, and phase change switch connections between the RF input pad and each of the RF output pads, wherein the phase change switch connections each include a phase change material and a heating element thermally coupled to the phase change material, wherein each of the RF output pads are arranged outside of an outer perimeter of the RF input pad, and wherein plurality of RF output pads at least partially surrounds the outer perimeter of the RF input pad.

20 Claims, 5 Drawing Sheets

PHASE CHANGE SWITCH ARRANGEMENT

BACKGROUND

Modern electronics applications require switching devices capable of accommodating very high frequency signals. For example, fifth generation (5G) wireless applications may operate in frequency bands on the order of 24 GHz (gigahertz) or higher. Maintaining correct ON/OFF ratio/isolation versus insertion loss/RoN (on-resistance) and $C_{OFF}$ (off-capacitance) for 5G applications may be difficult or impossible to achieve in current semiconductor technologies, such as CMOS technology. Phase change switches represent one promising technology that can meet high frequency requirements for 5G applications. Practical RF applications for phase change switches require downsize scaling while simultaneously maintaining a low on-resistance of the device. Thus, there is a need to provide phase change switches with higher current density.

SUMMARY

A phase change switching device is disclosed. According to an embodiment, the phase change switching comprises a semiconductor substrate comprising a main surface, an RF input pad and a plurality of RF output pads disposed over the main surface, and phase change switch connections between the RF input pad and each of the RF output pads, wherein the phase change switch connections each comprise a phase change material and a heating element thermally coupled to the phase change material, wherein each of the RF output pads are arranged outside of an outer perimeter of the RF input pad, and wherein plurality of RF output pads at least partially surrounds the outer perimeter of the RF input pad.

According to another embodiment, the phase change switching comprises a semiconductor substrate comprising a main surface, an RF input pad and a plurality of RF output pads disposed over the main surface, and phase change switch connections between the RF input pad and each of the RF output pads, wherein the phase change switch connections each comprise a phase change material and a heating element thermally coupled to the phase change material, wherein the phase change switch connections each form direct conductive connections with the RF input pad at different locations.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a PCM (phase change material) switching device and corresponding methods of forming the PCM switching device are disclosed herein. The PCM switching device comprises an RF input pad and a plurality of RF output pads that surround the RF input pad. The PCM switching device comprises phase change switch connections between the RF input pad and each of the RF output pads. Each of the phase change switch connections are connected such that current flows directly between the RF input pad and the phase change material, and directly between the phase change material to the RF output pads. That is, there are no metal tracks and/or runners that carry the current for multiple phase change switch connections. This arrangement provides a high degree of parallelization, thus lowering the on-resistance of the device. Moreover, this arrangement maximizes space efficiency by utilizing the complete area around the RF input pad for conduction. Moreover, this arrangement minimizes parasitics by minimizing the amount of metallization needed to form multiple parallel current paths.

Figure 1:
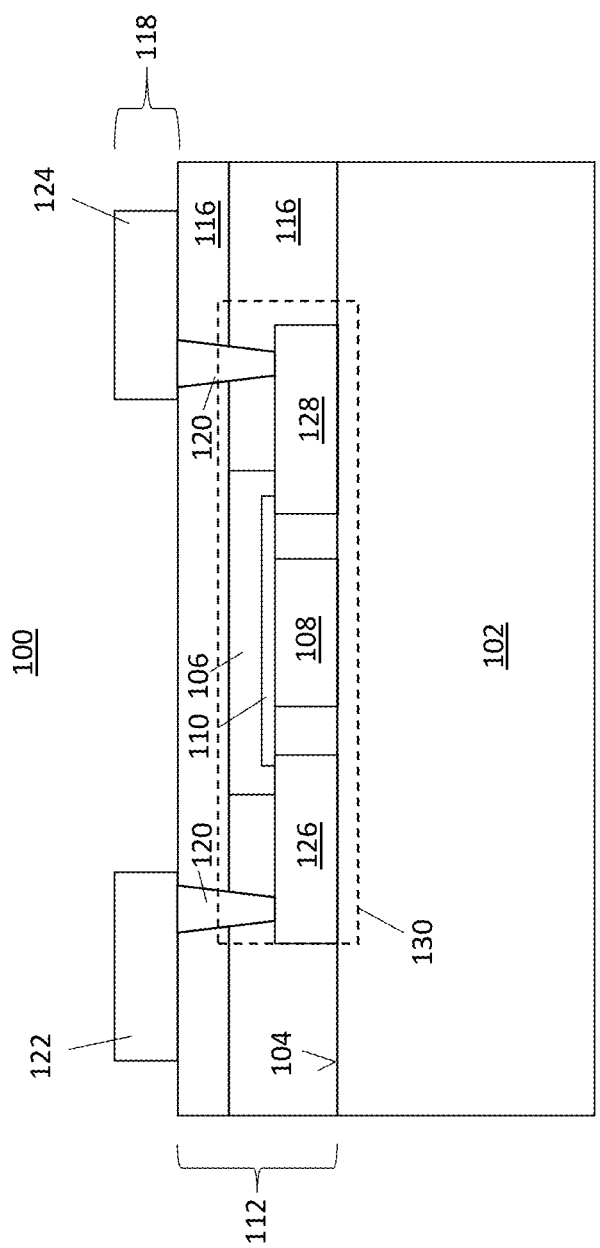
FIG. 1 illustrates a cross-sectional view of a PCM switching device, according to an embodiment.

Referring to FIG. 1, a phase change switching device 100 comprises a substrate 102 comprising a main surface 104. The main surface 104 may be a substantially planar surface. The substrate 102 may be any type of base structure that is compatible with phase change switch materials. For example, the substrate 102 can be a commercially available bulk semiconductor wafer, e.g., a silicon wafer. Other types of semiconductors such as silicon carbide (SiC), or silicon germanium (SiGe), type III-V semiconductors, etc., may be present in the substrate 102 and/or form the base material of the substrate 102. In still other examples, the substrate 102 can comprise other materials, e.g., glass, quartz, sapphire, etc.

The phase change switching device 100 comprises a region of phase change material 106 disposed on the substrate 102. The region phase change material 106 comprises material that can be transitioned between two different phases and thereby change its electrical conduction characteristics. For example, the region of phase change material 106 may comprise a material that changes from an amorphous state to a crystalline state in response to the application of heat to the phase change material, wherein the phase change material is electrically insulating (i.e., blocks an electrical connection) in the amorphous state and is electrically conductive (i.e., provides a low electrical resistance current path) in the crystalline state. Examples of phase change materials having this property include chalcogenides and chalcogenide alloys. Specifically, these phase change materials may include germanium-antimony-tellurium (GST), germanium-tellurium, and germanium-antimony.

The phase change switching device 100 comprises a heating element 108 disposed on the substrate 102. The heating element 108 is formed from a conductive or semi-conductive material that can be heated through ohmic heating. Examples of materials having this property include metals such as copper, aluminum, nickel, etc., and alloys thereof, crystalline materials such as polysilicon, and metal silicides such as copper silicide, aluminum silicide, nickel silicide, etc. The heating element 108 may be an elongated strip of material that extends transversely to the region of phase change material 106 in a direction transverse, e.g., perpendicular, to the cross-sectional perspective of FIG. 1.

The heating element 108 is thermally coupled to the region of phase change material 106. This means that the heating element 108 is in sufficient proximity to the region of phase change material 106 to rapidly transfer heat and change the conductive state of the region of phase change material 106 to perform the switching operation in the manner to be described below. As shown, the phase change switching device 100 may comprise an insulating liner 110 between the heating element 108 and the region of phase change material 106. The insulating liner 110 electrically isolates the heating element 108 from the region of phase change material 106 while simultaneously permitting substantial heat transfer between the two. To this end, the insulating liner 110 may be a relatively thin (e.g., less than 1 μm thick and more typically less than 100 nm thick) layer of dielectric material such as silicon dioxide ($SiO_2$), silicon nitride (SiN), etc.

The phase change switching device 100 comprises an interconnection region 112 formed on the main surface 104 of the substrate 102 The interconnection region 112 may correspond to a so-called BEOL (back-end of the line) region of the device. The features of the phase change switching device 100 including the heating element 108 and the region of phase change material 106 may be formed by a so-called FEOL (front-end off-line) process. The BEOL region of the device is formed after the FEOL process and is configured to provide electrical interconnections between the devices formed by the FEOL process and to form externally accessible terminals (e.g., bond pads) on an outer surface of the device. The interconnection region 112 comprises dielectric layers 116 and at least one structured metallization layer 118. The dielectric layers 116 may comprise silicon dioxide ($SiO_2$), silicon oxynitride ($SiO_XN_Y$), glass, polymers, etc. The structured metallization layer 118 may comprise copper, aluminum, nickel, etc., and alloys thereof. The interconnection region 112 may further comprise through-vias 120 that provide vertical connections through the dielectric layers 116. The through-vias 120 may comprise electrically conductive material such as tungsten, nickel, copper, aluminum, etc. Instead of the single layer embodiment shown in the figure, the interconnection region 112 may comprise multiple structured metallization layers 118 with each of these layers being vertically electrically isolated from one another by the dielectric layers 116.

The phase change switching device 100 comprises an RF input pad 122 and an RF output pad 124 disposed over the main surface 104 of the substrate 102. The RF input pad 122 and the RF output pad 124 are electrically isolated pad regions formed in the structured metallization layer 118. As shown, the structured metallization layer 118 may be the uppermost metallization layer of the interconnection region 112 such that the RF input pad 122 and the RF output pad 124 correspond to externally accessible terminals, e.g., bond pads. The region of phase change material 106 is electrically connected between the RF input pad 122 and the RF output pad 124. In the depicted embodiment, the phase change switching device 100 comprises first and second contact pads 126, 128 that facilitate this connection. first and second contact pads 126, 128 may be electrically conductive structures comprising, e.g., tungsten, polysilicon, or a metal silicide, etc., that are formed as part of the FEOL process. The first and second contact pads 126, 128 may each be in ohmic contact with the region of phase change material 106 at opposite ends. The RF input pad 122 is in direct ohmic contact with a through-via 120, which in turn is in direct ohmic contact with the first contact pad 126. Likewise, the RF output pad 124 is in direct ohmic contact with a through-via 120, which in turn is in direct ohmic contact with the second contact pad 128. Thus, the RF input pad 122 and the RF output pad 124 are electrically connected to opposite ends of the region of phase change material 106.

The working principle of the phase change switching device 100 is as follows. In an OFF state of the phase change switching device 100, the phase change material is in an amorphous state or partially amorphous state. As a result, the region of phase change material 106 blocks a voltage between the RF input pad 122 and the RF output pad 124. In an ON state of the phase change switching device 100, the phase change material is in a crystalline state. As a result, the region of phase change material 106 provides a low-resistance electrical connection between the RF input pad 122 and the RF output pad 124. The switching operation is performed by applying heat to the region of phase change material 106 from the heating element 108. Thus, the heating element 108 operates as a gate structure that controls a conductive connection between the RF input pad 122 and the RF output pad 124. The phase change material may be transitioned to the amorphous state by applying short pulses (e.g., pulses in the range of 50-1,000 nanoseconds) of high intensity heat which causes the phase change material to reach a melting temperature, e.g., in the range of 600° C. to 750° C., followed by a rapid cooling of the material. This is referred to as a "reset pulse." The phase change material may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C. This is referred to as a "set pulse."

FIG. 1 illustrates an embodiment of phase change switch connection 130 from a cross-sectional perspective. In the instant specification, a phase change switch connection 130 refers to a controllable conductive path that is electrically connected between an RF input pad 122 an RF output pad 124 and comprises a region of phase change material 106 and a heating element 108 thermally coupled to the phase change material. FIGS. 2-5 illustrate embodiments of a phase change switching device 100 comprising multiple phase change switch connections 130. That is, the controllable conductive path between the RF input pad 122 an RF output pad 124 is provided is provided multiple times. The phase change switch connections 130 in any of these embodiments may vary from the cross-sectional configuration shown in FIG. 1. For example, the orientation of the heating element 108 and the region of phase change material 106 may be changed such that the heating element 108 is disposed above and/or to the side of the region of phase change material 106. Separately or in combination, the first and second contact pads 126, 128 may be omitted such that the through-vias 120 are in direct ohmic contact with the region of phase change material 106.

Figure 2:
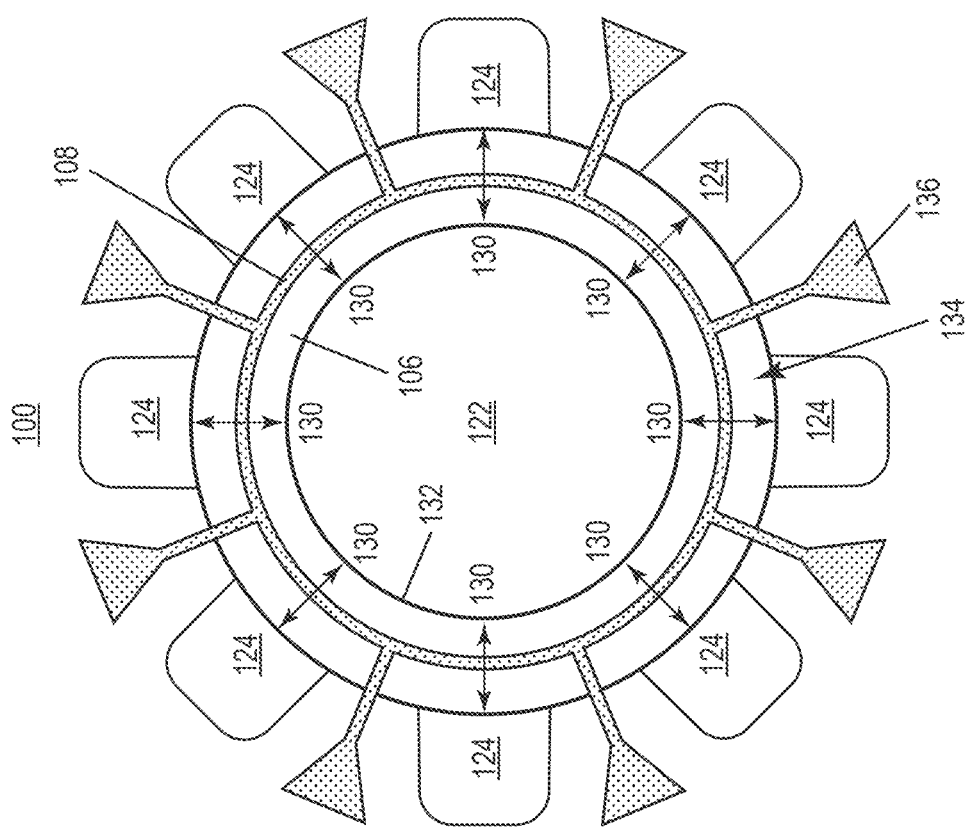
FIG. 2 illustrates a plan view of a PCM switching device, according to an embodiment.

Referring to FIG. 2, a phase change switching device 100 is shown from a plan-view perspective, according to an embodiment. The phase change switching device 100 comprises a plurality of RF output pads 124 arranged outside of an outer perimeter 132 of the RF input pad 130. That is, a lateral separation distance is provided between the outer perimeter 132 of the RF input pad 122 and inward facing sides of each one of the RF output pads 124 from the plan-view perspective. In the depicted embodiment, the outer perimeter 132 of the RF input pad 122 has a circular geometry. More generally, the outer perimeter 132 of the RF input pad 122 can have a variety of different geometries including any type of ellipse geometry or a polygonal geometry, examples of which will be disclosed below. In the depicted embodiment, the phase change switching device 100 comprises eight of the RF output pads 124. More generally, the phase change switching device 100 may comprise any plurality of the of the RF output pads 124, e.g., two, three, four, five, six, seven, eight, nine, ten, etc.

The phase change switching device 100 comprises a plurality of phase change switch connections 130 between the RF input pad 122 and each of the RF output pads 124. Thus, the phase change switching device 100 is configured with a plurality of conduction paths in parallel with one another, thereby lowering the on-resistance in comparison to a single conduction path configuration. Each of the phase change switch connections 130 form direct conductive connections with the RF input pad 122 at different locations. In this context, the term "direct conductive connection" means that there are no additional spans of interconnect metallization, e.g., in the form of metal runners, to effectuate the connection between the RF input pad 122 and the phase change material 106 for each of the phase change switch connections 130. Instead, the phase change switching device 100 is configured such that the outer perimeter 132 of the RF input pad 122 is close to the phase change material 106, thus allowing for the direct conductive connection to be effectuated by through-vias 120 that are in direct ohmic contact with the RF input pad 122. While the depicted embodiment shows the outer perimeter 132 of the RF input pad 122 bordering the phase change material 106 from a plan-view perspective, other close proximity arrangements are possible such as an arrangement wherein the phase change material 106 overlaps with the outer perimeter 132 of the RF input pad 122 or an arrangement wherein the phase change material 106 is laterally spaced apart from a plan-view perspective but sufficiently close to enable a direct conductive connection by the through-vias 120. By configuring the phase change switch connections 130 in this way, parasitic impacts from metallization can be minimized and space efficiency can be improved.

According to an embodiment, the plurality of RF output pads 124 comprises at least two of the RF output pads 124 that are arranged on opposite facing sides of the outer perimeter 132 of the RF input pad 122. In this context, "opposite facing sides" refers to segments of the outer perimeter 132 that are intersected by a common bisector of the shape. Thus, in the case of a circular geometry, the opposite facing sides refer to two locations on the outer perimeter 132 of the RF input pad 122 that are diametrically opposed from one another. In the case of a rectangular geometry, the opposite facing sides refer to the sides on the outer perimeter 132 of the RF input pad 122 that are parallel and spaced apart from one another. In the depicted embodiment, the phase change switching device 100 comprises four pairs of the of the RF output pads 124 that are each arranged on opposite facing sides of the outer perimeter 132 of the RF input pad 122.

In the embodiment of FIG. 2, the RF output pads 124 are arranged in a pattern that completely surrounds the RF input pad 122. In this context, "completely surrounds" refers to an arrangement wherein a maximum length of any segment of the outer perimeter 132 that is between two immediately adjacent ones of the one of the RF output pads 124 is no more than 25% of an overall length of the RF input pad 122. That is, the RF output pads 124 occur with sufficient frequency to expose no more than 25% of the outer perimeter 132 at a time. By arranging the RF output pads 124 to completely surround the RF input pad 122, space efficiency and current density can be maximized.

In the embodiment of FIG. 2, the phase change switching device 100 comprises a continuous span of the phase change material 106 that surrounds the outer perimeter 132 of the RF input pad 122. This continuous span of the phase change material 106 provides the phase change material 106 for each of the phase change switch connections 130. The continuous span of the phase change material 106 may be a uniform with span that mimics the outer perimeter 132 of the RF input pad 122.

In the embodiment of FIG. 2, the phase change switching device 100 comprises a single continuous heater structure that provides the heating element 108 for each of the phase change switch connections 130. The heater structure comprises an interior ring 134 that surrounds the RF input pad 122 and forms the heating elements 108 and a plurality of heating terminals 136 that are connected with the interior ring 134. The interior ring 134 is heated by creating a potential difference between pairs of heating terminals 136. For example, every other one of the heating terminals 136 can be biased at a positive potential with alternating ones of the heating terminals 136 biased at ground or negative potential.

In the embodiment of FIG. 2, the phase change switch connections 130 are arranged as linear spokes that fan out from the RF input pad 122 at different angular orientations. That is, the phase change switch connections 130 form linear conduction paths that radially diverge from one another. These linear conduction paths may originate from a common point, such as a centroid of the RF input pad 122. According to an embodiment, the angular orientation between two of the phase change switch connections 130 is about 180 degrees. In this context, "about 180 degrees" refers to an orientation that is within +/10 degrees of 180 degrees. This arrangement thus provides two of the phase change switch connections 130 extending away from one another in substantially opposite directions. In the depicted embodiment, the phase change switching device 100 comprises four pairs of the phase change switch connections 130 that are each arranged 180 degrees apart from one another. According to an embodiment, the angular orientation between each of the phase change switch connections 130 is substantially the same. This means that the angular orientation between immediately adjacent phase change switch connections 130 does not vary by more than 5 degrees throughout the entire plurality of the RF output pads 124.

The above-described relationships allow for the number of phase change switch connections 130 and/or the current carrying capacity of phase change switch connections 130 to be maximized. As is known in the art, device features are limited by design rules that dictate geometric relationships between features based on the processing capabilities of the techniques used to form the devices, e.g., lithography resolution, etching capability, etc. Examples of these design rules include minimum separation distances between like features, e.g., metallization regions, via structures, etc. By implementing the above-described relationships, such as arranging the RF the output pads in a pattern that completely surrounds the RF input pad 122, minimizing the separation distance between the RF output pads 124, e.g., by making the angular orientation between each of the phase change switch connections 130 substantially the same, arranging the heating terminals 136 at locations that do not interfere with the phase change switch connections 130, e.g., by providing single a continuous heater structure, the number of phase change switch connections 130 for a given process technology can be maximized.

Figure 3:
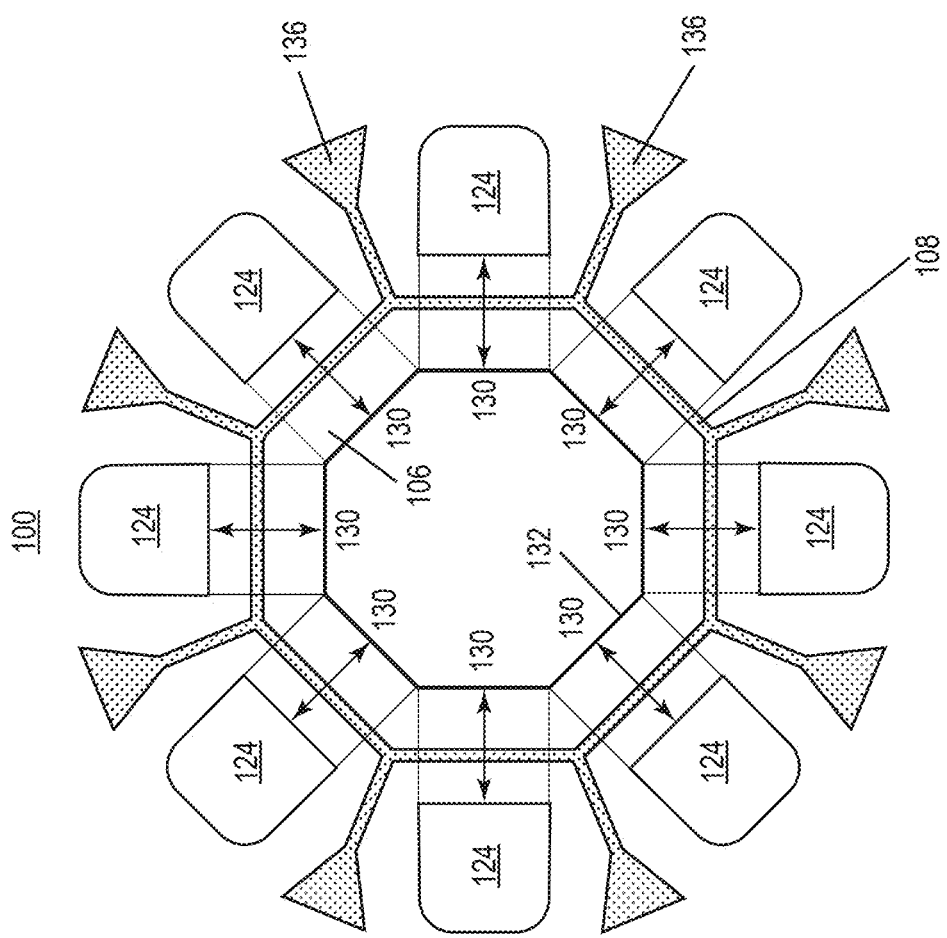
FIG. 3 illustrates a plan view of a PCM switching device, according to an embodiment.

Referring to FIG. 3, the phase change switching device 100 is shown from a plan-view perspective, according to another embodiment. In this embodiment, the outer perimeter 132 of the RF input pad 122 forms a convex polygon. In particular, the outer perimeter 132 of the RF input pad 122 is arranged as a regular octagon, i.e., an octagon with equal length sides. More generally, the outer perimeter 132 of the RF input pad 122 can have a variety of different convex polygon shapes. Examples of these convex polygon shapes include triangles, rectangles, pentagons, hexagons, etc. These different convex polygon shapes may be regular convex polygons, i.e., with equal length sides, or irregular convex polygons, i.e., with different length sides.

In the embodiment of FIG. 3, the phase change switching device 100 comprises discrete spans of the phase change material 106 that each extend between one of the sides of the convex polygon and one of the RF output pads 124. That is, the phase change switching device 100 comprises strips of the phase change material 106 that each have outer edge sides extending linearly between the outer perimeter 132 of the RF input pad 122 and the RF output pads 124.

In the embodiment of FIG. 3, one of the RF output pads 124 is provided for each one of the sides of the convex polygon and the phase change switching device 100 thus comprises phase change switch connections 130 extending between each one of the sides of the convex polygon and one of the RF output pads 124. The phase change switching device 100 thus provides similar parallelization of the current flow in comparison to the embodiment of FIG. 1. However, the features of this device including the convex polygon geometry of the RF input pad 122 and the discrete spans of the phase change material 106 may allow for easier manufacturability.

Figure 4:
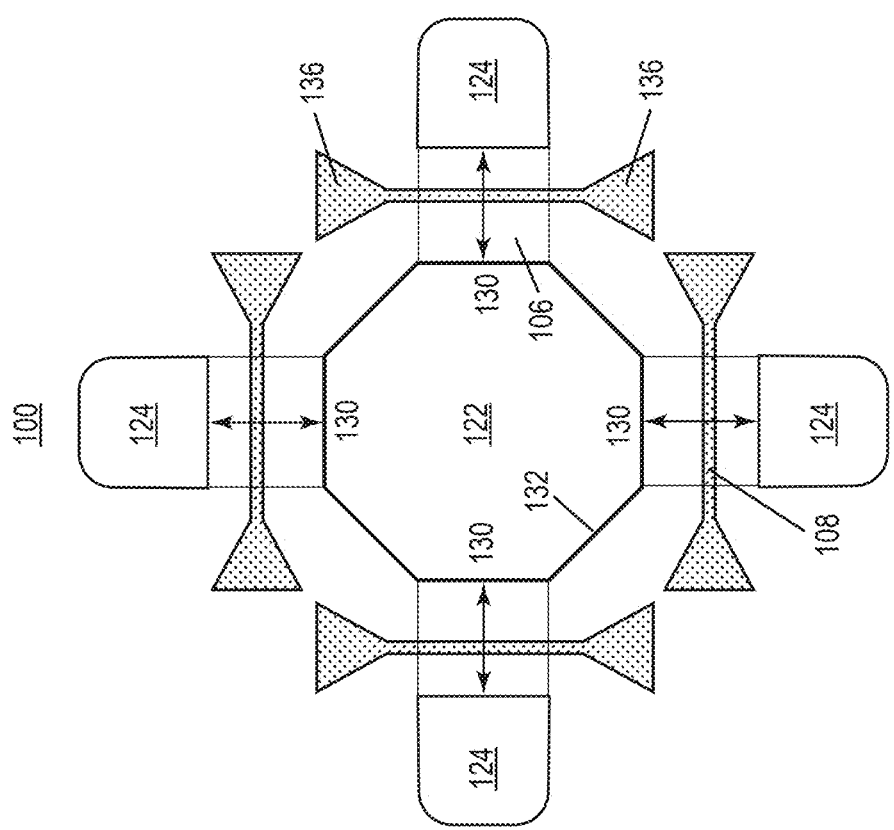
FIG. 4 illustrates a plan view of a PCM switching device, according to an embodiment.

Referring to FIG. 4, the phase change switching device 100 is shown from a plan-view perspective, according to another embodiment. In this embodiment, the phase change switching device 100 comprises a plurality of discrete heater structures that each provide the heating element 108 for one of the phase change switch connections 130. Each heater structure comprises a heating element 108 that is thermally coupled to one of the discrete spans of the phase change material 106 and two heating terminals 136 that are connected with the heating element 108.

In the embodiment of FIG. 4, the RF output pads 124 are provided for only some of the sides of the RF input pad 122 and thus the phase change switch connections 130 extend only between some of the sides of the RF input pad 122 and the RF output pads 124. This arrangement may allow for easier manufacturability in comparison to other embodiments.

Figure 5:
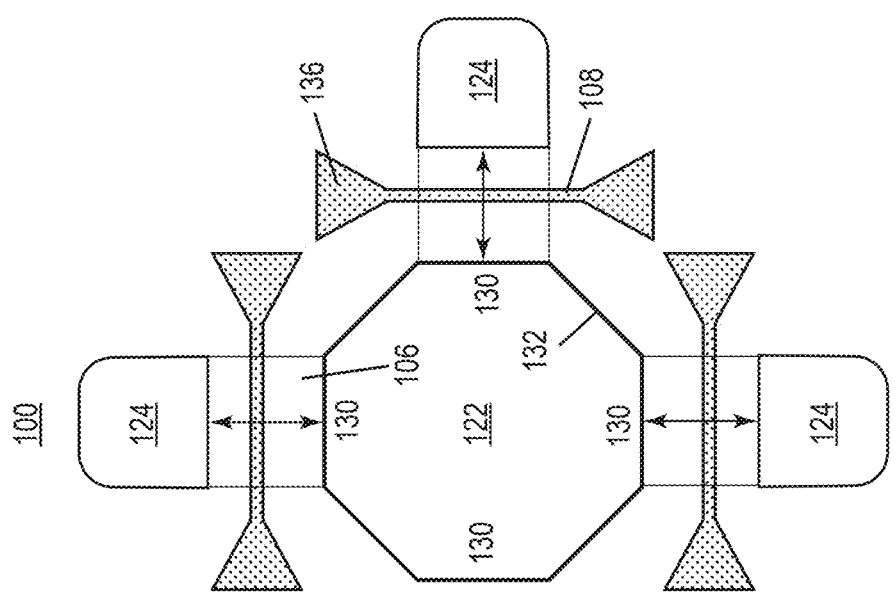
FIG. 5 illustrates a plan view of a PCM switching device, according to an embodiment.

Referring to FIG. 5, the phase change switching device 100 is shown from a plan-view perspective, according to another embodiment. In this embodiment, the RF output pads 124 are arranged in a pattern that partially surrounds the RF input pad 122. In this context, "partially surrounds" refers to an arrangement wherein a maximum length of any segment of the outer perimeter 132 that is between two immediately adjacent ones of the one of the RF output pads 124 is no more than 50% of an overall length of the RF input pad 122. Thus, no more than one half of the RF input pad 122 remains unused for phase change switch connections 130. As shown, the phase change switching device 100 comprises three of the RF output pads 124. More generally, any number of RF output pads 124 may be provided to partially surround the RF input pad 122. Such an arrangement may be preferred if, for instance, space constraints make it infeasible to arrange the RF output pads 124 in a completely surrounding pattern. The phase change switching device 100 may nevertheless comprise multiple phase change connections 130 and thus provide the beneficial parallelization as described herein.

Although the present disclosure is not so limited, the following numbered examples demonstrate one or more aspects of the disclosure.

Example 1. A phase change switching device, comprising: a substrate comprising a main surface; an RF input pad and a plurality of RF output pads disposed over the main surface; and phase change switch connections between the RF input pad and each of the RF output pads, wherein the phase change switch connections each comprise a phase change material and a heating element thermally coupled to the phase change material, wherein each of the RF output pads are arranged outside of an outer perimeter of the RF input pad, and wherein plurality of RF output pads at least partially surrounds the outer perimeter of the RF input pad.

Example 2. The phase change switching device of example 1, wherein the plurality of RF output pads comprises at least three of the RF output pads.

Example 3. The phase change switching device of example 2, wherein the plurality of RF output pads comprises at least two of the RF output pads that are arranged on opposite facing sides of the outer perimeter.

Example 4. The phase change switching device of example 2, wherein the plurality of RF output pads comprises at least four of the RF output pads.

Example 5. The phase change switching device of example 1, wherein the outer perimeter of the RF input pad forms a convex polygon, and wherein the phase change switch connections extend between sides of the convex polygon and the RF output pads.

Example 6. The phase change switching device of example 5, wherein the outer perimeter of the RF input pad forms an octagon.

Example 7. The phase change switching device of example 5, wherein the plurality of RF output pads comprises one of the RF output pads for each one of the sides of the convex polygon, and wherein the phase change switch connections extend between each one of the sides of the convex polygon and one of the RF output pads.

Example 8. The phase change switching device of example 5, wherein the phase change switch comprises discrete spans of the phase change material that each extend between one of the sides of the convex polygon and one of the RF output pads and provide the phase change material for one of the phase change switch connections.

Example 9. The phase change switching device of example 5, wherein the phase change switching device comprises a single continuous heater structure that provides the heating element for each of the phase change switch connections.

Example 10. The phase change switching device of example 5, wherein the phase change switching device comprises a plurality of discrete heater structures that each provide the heating element for one of the phase change switch connections.

Example 11. The phase change switching device of example 1, wherein the outer perimeter of the RF input pad forms an ellipse, and wherein the phase change switching device comprises a continuous span of the phase change material that surrounds the outer perimeter of the RF input pad and provides the phase change material for each of the phase change switch connections.

Example 12. A phase change switching device, comprising: a substrate comprising a main surface; an RF input pad and a plurality of RF output pads disposed over the main surface; and phase change switch connections between the RF input pad and each of the RF output pads, wherein the phase change switch connections each comprise a phase change material and a heating element thermally coupled to the phase change material, wherein the phase change switch connections each form direct conductive connections with the RF input pad at different locations.

Example 13. The phase change switching device of example 12, wherein the phase change switch connections are arranged as linear spokes that fan out from the RF input at different angular orientations.

Example 14. The phase change switching device of example 13, wherein the phase change switching device comprises at least three of the phase change switch connections.

Example 15. The phase change switching device of example 13, wherein the angular orientation between two of the phase change switch connections is about 180 degrees.

Example 16. The phase change switching device of example 13, wherein the angular orientation between each of the phase change switch connections is substantially the same.

Example 17. The phase change switching device of example 12, wherein the phase change switching device comprises an interconnection region on the main surface of the substrate, and wherein the RF input pad is formed in an uppermost metallization layer of the interconnection region.

Example 18. The phase change switching device of example 17, wherein the phase change material from each of the phase change switch connections is electrically connected to the RF input pad by a through-via that is direct ohmic contact with the RF input pad.

Example 19. The phase change switching device of example 18, wherein the phase change material from each of the phase change switch connections is electrically connected to the RF output pad by through-vias that are in direct ohmic contact with the RF output pad.

Example 20. The phase change switching device of example 12, wherein the phase change switching device comprises a single continuous heater structure that provides the heating element for each of the phase change switch connections.

The methods and structures disclosed herein with reference to specific figures are applicable to all other embodiments to the extent consistent with these other embodiments. For instance, particular techniques, materials, steps and so-forth describing a method of forming a device represented by one figure may be applied to any other method represented by other figures, to the extent consistent with these other methods. Likewise, particular device features, structures or arrangements disclosed in connection with a device represented by one figure may be incorporated into a device represented any other figures, to the extent consistent with these other devices.

The term "electrically connected," as used herein describes a permanent low-impedance connection between electrically connected elements, for example a direct contact between the relevant elements or a low-impedance connection via a metal and/or a highly doped semiconductor.

The term "in direct ohmic contact" as used herein refers to an electrical connection between two electrically conductive elements that directly physically contact one another and form a non-rectifying electrical junction with one another.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase change switching device, comprising:
a substrate comprising a main surface;
an RF input pad and a plurality of RF output pads disposed over the main surface; and
phase change switch connections between the RF input pad and each of the RF output pads,
wherein the phase change switch connections each comprise a phase change material and a heating element thermally coupled to the phase change material,
wherein each of the RF output pads are arranged outside of an outer perimeter of the RF input pad, and
wherein plurality of RF output pads at least partially surrounds the outer perimeter of the RF input pad.

2. The phase change switching device of claim 1, wherein the plurality of RF output pads comprises at least three of the RF output pads.

3. The phase change switching device of claim 2, wherein the plurality of RF output pads comprises at least two of the RF output pads that are arranged on opposite facing sides of the outer perimeter.

4. The phase change switching device of claim 2, wherein the plurality of RF output pads comprises at least four of the RF output pads.

5. The phase change switching device of claim 1, wherein the outer perimeter of the RF input pad forms a convex polygon, and wherein the phase change switch connections extend between sides of the convex polygon and the RF output pads.

6. The phase change switching device of claim 5, wherein the outer perimeter of the RF input pad forms an octagon.

7. The phase change switching device of claim 5, wherein the plurality of RF output pads comprises one of the RF output pads for each one of the sides of the convex polygon, and wherein the phase change switch connections extend between each one of the sides of the convex polygon and one of the RF output pads.

8. The phase change switching device of claim 5, wherein the phase change switch comprises discrete spans of the phase change material that each extend between one of the sides of the convex polygon and one of the RF output pads and provide the phase change material for one of the phase change switch connections.

9. The phase change switching device of claim 5, wherein the phase change switching device comprises a single continuous heater structure that provides the heating element for each of the phase change switch connections.

10. The phase change switching device of claim 5, wherein the phase change switching device comprises a plurality of discrete heater structures that each provide the heating element for one of the phase change switch connections.

11. The phase change switching device of claim 1, wherein the outer perimeter of the RF input pad forms an ellipse, and wherein the phase change switching device comprises a continuous span of the phase change material that surrounds the outer perimeter of the RF input pad and provides the phase change material for each of the phase change switch connections.

12. A phase change switching device, comprising:
a substrate comprising a main surface;
an RF input pad and a plurality of RF output pads disposed over the main surface;
phase change switch connections between the RF input pad and each of the RF output pads,
wherein the phase change switch connections each comprise a phase change material and a heating element thermally coupled to the phase change material,
wherein the phase change switch connections each form direct conductive connections with the RF input pad at different locations.

13. The phase change switching device of claim 12, wherein the phase change switch connections are arranged as linear spokes that fan out from the RF input at different angular orientations.

14. The phase change switching device of claim 13, wherein the phase change switching device comprises at least three of the phase change switch connections.

15. The phase change switching device of claim 13, wherein the angular orientation between two of the phase change switch connections is about 180 degrees.

16. The phase change switching device of claim 13, wherein the angular orientation between each of the phase change switch connections is substantially the same.

17. The phase change switching device of claim 12, wherein the phase change switching device comprises an interconnection region on the main surface of the substrate, and wherein the RF input pad is formed in an uppermost metallization layer of the interconnection region.

18. The phase change switching device of claim 17, wherein the phase change material from each of the phase change switch connections is electrically connected to the RF input pad by a through-via that is direct ohmic contact with the RF input pad.

19. The phase change switching device of claim 18, wherein the phase change material from each of the phase change switch connections is electrically connected to the RF output pad by through-vias that are in direct ohmic contact with the RF output pad.

20. The phase change switching device of claim 12, wherein the phase change switching device comprises a single continuous heater structure that provides the heating element for each of the phase change switch connections.

* * * * *